(12) United States Patent
McCordic et al.

(10) Patent No.: US 8,757,246 B2
(45) Date of Patent: Jun. 24, 2014

(54) HEAT SINK AND METHOD OF MAKING SAME

(75) Inventors: Craig H. McCordic, Medfield, MA (US); Leo S. Ludwick, Somerville, MA (US)

(73) Assignee: Raytheon Company, Waltham, MA (US)

( * ) Notice: Subject to any disclaimer, the term of this patent is extended or adjusted under 35 U.S.C. 154(b) by 935 days.

(21) Appl. No.: 11/447,488

(22) Filed: Jun. 6, 2006

(65) Prior Publication Data

US 2007/0289718 A1   Dec. 20, 2007

(51) Int. Cl.
*F28F 13/02*   (2006.01)
*F28F 7/02*   (2006.01)

(52) U.S. Cl.
USPC .......................... 165/80.4; 165/146; 165/147

(58) Field of Classification Search
USPC ............... 165/80.4, 80.5, 146, 147; 361/699; 257/714
See application file for complete search history.

(56) References Cited

U.S. PATENT DOCUMENTS

| | | | |
|---|---|---|---|
| 3,362,468 A * | 1/1968 | Olson ........................... | 165/110 |
| 4,953,634 A * | 9/1990 | Nelson et al. ................. | 165/185 |
| 5,982,621 A | 11/1999 | Li | |
| 6,097,335 A | 8/2000 | Cassen et al. | |
| 6,179,051 B1 * | 1/2001 | Ayub ........................... | 165/167 |
| 6,253,835 B1 | 7/2001 | Chu et al. | |
| 6,462,949 B1 | 10/2002 | Parish, IV et al. | |
| 6,903,931 B2 | 6/2005 | McCordic et al. | |
| 7,237,600 B2 * | 7/2007 | Tippmann ..................... | 165/119 |
| 2001/0003309 A1 * | 6/2001 | Aoyagi et al. ............. | 165/109.1 |
| 2003/0115753 A1 | 6/2003 | Klett et al. | |
| 2003/0168205 A1 * | 9/2003 | Bhatti et al. ................. | 165/80.4 |
| 2003/0230400 A1 * | 12/2003 | McCordic et al. ....... | 165/104.33 |
| 2005/0103473 A1 | 5/2005 | Todd et al. | |
| 2005/0117301 A1 | 6/2005 | Prasher et al. | |
| 2005/0211416 A1 | 9/2005 | Kawabata et al. | |
| 2006/0102332 A1 | 5/2006 | Taras et al. | |
| 2007/0235174 A1 * | 10/2007 | Dakhoul ....................... | 165/167 |

* cited by examiner

Primary Examiner — Teresa J Walberg

(57) ABSTRACT

A heat sink includes a fluid channel and a cooling wall in contact with coolant flowing in the fluid channel. The channel is configured to vary the velocity of coolant along the length of the fluid channel to vary the coolant's heat transfer coefficient and thereby compensate for the coolant's temperature rise along the length of the fluid channel. The result is a heat sink that is isothermal along its length.

23 Claims, 13 Drawing Sheets

HEAT SINK AND METHOD OF MAKING SAME

GOVERNMENT RIGHTS

This invention was made with U.S. Government support under Contract No. Q1-19041-011 awarded by the United States Navy. The Government may have certain rights in the subject invention.

FIELD OF THE INVENTION

The subject invention relates to the control and reduction of thermal gradients, and, in one example, to a heat sink which may be used in a phased array radar system.

BACKGROUND OF THE INVENTION

Phased array radar systems employ amplifiers and phase shifters to electronically steer radio frequency (RF) beams, in contrast to the more familiar rotating radar dish. By using phase shifts, phased array radar systems eliminate the time delay between signals that is typically associated with rotating systems as the dish rotates 360°. Thus, phased array radar systems result in improved performance.

One key parameter governing the RF performance of a phased array radar system, however, is the temperature or thermal gradient at all levels of the system. This is due to the fact that the RF performance changes with temperature. The gain and the phase shift of an amplifier each change with a change in temperature. The gain changes approximately 0.1 dB/° C. and the phase changes approximately 0.8°/° C. Thus, controlling thermal gradients in phased array radar systems is an important and challenging requirement to meet.

At the component level, heat sources such as integrated circuits and/or electrical components—for example the amplifiers in the transmit/receive (T/R) modules of the phased array radar system—must not only be cooled, but it is also important that the temperature gradient between any two such heat sources be minimized. One way to cool the amplifiers is to mount them on a cold plate which dissipates the heat from the amplifiers. Because the distance from each amplifier to the cooled edge of the cold plate varies, however, the amplifiers which are located the greatest distance from the cooled edge of the cold plate (e.g., the interior mounted amplifiers) operate at a higher temperature than the edge mounted amplifiers.

Various methods and systems have been devised to eliminate this level of thermal gradients. One system utilizes a cold plate assembly including inwardly directed tabs extending from opposing cooled edges of the cold plate. The tabs include orifices therethrough which are aligned with orifices in the skins of the cold plate, thus reducing the conductivity of the cooled edges of the cold plate. Consequently, the temperature gradient between edge mounted heat sources—amplifiers for example—and inwardly mounted heat sources is effectively reduced. See U.S. Pat. No. 6,903,931 incorporated herein in its entirety by this reference.

While this latter system and method, as well as others, have proven effective at cooling the components and reducing or eliminating the thermal gradient between the components of the T/R modules, additional thermal gradients arise at other levels of the phased array radar system.

For example, after the T/R modules including the foregoing cold plates and electrical components are attached to a T/RIMM (transmit/receive integrated multi-channel module), several hundred T/RIMMs may be combined to form the phased array. Each series of T/RIMMs are then in turn cooled by a plurality of cooling manifolds or heat sinks which are typically fluid cooled. Given the size of these arrays and the large number of T/RIMMs cooled along the way, the fluid flowing through the manifold undergoes an increase in temperature between the time of entry into and exit from the manifold. In other words, as the fluid flows, its temperature increases as it absorbs heat from the various T/RIMMs it serves to cool, resulting in hotter T/RIMMs located further downstream. Thus, an undesirable thermal gradient is generated at this level of the phased array radar system as well.

In an attempt to create an isothermal heat sink or manifold, most previous designs depend on vacuum brazed aluminum cooling manifolds with tailored heat transfer passages, cooling channels designed to take advantage of cross or counter flow, or by "shifting" the coolant away from some components or heat sources to effectively increase the temperature of devices when the coolant is the coldest. In one recent example, brazed aluminum manifolds have been used to convection/conduction cool electronic components by filling the cooling channels in the manifold with a fin stock that increases the heat transfer area at the expense of a greater fluid pressure drop.

These brazed manifolds/heat sinks provide distinct disadvantages, however.

One disadvantage is that the tailored heat passages provide a "calibration" that is only effective for a single heat dissipation. Given such a specific "calibration", if the radar duty cycles are changed or if the system is put in a receive only mode, for example, the carefully calculated zero thermal gradient is thrown out of balance. Thus, thermal gradients may arise when a manifold with tailored passages is subjected to varying conditions.

Moreover, because of the complex cooling channel geometry; including tailored heat transfer passages, cooling channels designed to take advantage of techniques of cross or counter flow, or designs which "shift" coolant away from some components; brazed aluminum manifolds are expensive, typically have long lead times, and in some cases can be difficult to manufacture.

An additional disadvantage of such heat sinks or manifolds follows from that fact that vacuum brazing furnaces are limited in size. While furnaces are typically less than twelve feet long, larger arrays can be up to one hundred feet long. Thus, for larger arrays manufacturing becomes more difficult and expensive. Even with facilities large enough to braze some larger manifolds, special brazing expertise is required to build acceptable parts without significant repair and reworking.

SUMMARY OF THE INVENTION

It is therefore an object of this invention to provide an improved heat sink.

It is a further object of this invention to provide a more compact, less complex, heat sink.

It is a further object of this invention to provide a less expensive heat sink.

It is a further object of this invention to provide a heat sink with reduced thermal gradients.

The subject invention results from the realization that an improved heat sink can be achieved with a fluid channel configured to vary the velocity of coolant as it flows down the length of the channel. In this way, the coolant's heat transfer coefficient is also varied, thereby compensating for a rise in the coolant's temperature as it flows along the length of the fluid channel, with more uniform cooling as a result. In one preferred embodiment the coolant velocity in the channel can be varied by a tapered body placed within the fluid channel to form a tapered cooling channel annulus. The invention results from the further realization that an improved heat sink can be achieved by varying the heat transfer area in contact with the coolant in order to compensate for increasing coolant temperature as the coolant flows the length of the channel. An improved heat sink in accordance with this invention can also be achieved with a fluid channel configured to vary the velocity of the coolant and vary the heat transfer area in contact with the coolant.

The present invention thus provides a unique way to control thermal gradients and to produce an isothermal heat transfer surface. The surface temperature increases, but remains uniform. This uniform temperature is present even if, in one example, the power or duty cycle of a phased array radar system—with which the present invention may be used—is increased. The present invention thus provides a less expensive, less complex device which solves the thermal gradient problem. Also, because no brazing is required, the present invention allows for the use of extruded or gun drilled manifolds for the heat sink which are very low risk compared to brazed aluminum manifolds.

The subject invention, however, in other embodiments, need not achieve all these objectives and the claims hereof should not be limited to structures or methods capable of achieving these objectives.

This invention features a heat sink comprising a fluid channel and a cooling wall in contact with a coolant flowing in the fluid channel. The fluid channel is configured to vary the velocity of the coolant along the length of the fluid channel to vary the coolant's heat transfer coefficient and thereby compensate for the coolant's temperature rise along the length of the fluid channel. In one example, the fluid channel may be configured to form a tapered annulus along its length. The cooling wall may have a constant area along the length of the channel. The fluid channel may include a tapered body therein, which may taper upward in the direction of the coolant flow in the fluid channel. The cooling wall typically defines a cooling surface, and the area of the cooling wall and the tapered body may be selected to maintain a constant temperature cooling surface. In one example, the tapered body may have a variable taper and the fluid channel may be round. The tapered body may be made of plastic or aluminum and the cooling wall may be made of aluminum. In another embodiment, the fluid channel may be configured to form stepped portions of increasing diameter along its length. The coolant may be a gas or a liquid. The fluid channel may be drilled, or the heat sink may be extruded to form the fluid channel. The cooling surface typically would include heat sources attached thereto, and the heat sources may be transmit/receive integrated multi-channel modules.

The invention also features a heat sink comprising a fluid channel, a cooling wall in contact with a coolant flowing in the fluid channel, and a tapered body in the fluid channel which tapers upward in the direction of the coolant flow in the fluid channel to vary the velocity of the coolant along the length of the fluid channel to vary the coolant's heat transfer coefficient and thereby compensate for the coolant's temperature rise along the length of the fluid channel.

This invention further features a phased array radar system comprising at least one heat sink including a fluid channel and a cooling wall in contact with a coolant flowing in the fluid channel, where the fluid channel is configured to vary the velocity of the coolant along the length of the fluid channel to vary the coolant's heat transfer coefficient and thereby compensate for the coolant's temperature rise along the length of the fluid channel. A plurality of transmit/receive integrated multichannel modules is mounted on the cooling wall. The fluid channel may be configured to form a tapered annulus along its length, and the cooling wall may have a constant area along the length of the channel, and the fluid channel may include a tapered body therein. The tapered body may taper upward in the direction of the coolant flow in the fluid channel. The cooling wall typically defines a cooling surface. The area of the cooling wall and the tapered body may be selected to maintain a constant temperature cooling surface. In one example, the tapered body may have a variable taper, and the fluid channel may be round. The tapered body may be made of plastic or aluminum and the cooling wall may be made of aluminum. In another example, the fluid channel may be configured to form stepped portions of increasing diameter along its length. The coolant may be a gas or a liquid. The fluid channel may be drilled or the heat sink may be extruded to form the fluid channel.

This invention also features a heat transfer method comprising placing heat sources on a cooling wall surrounding a fluid channel, driving a coolant through the fluid channel, and varying the velocity of the coolant along the length of the fluid channel to vary the coolant's heat transfer coefficient and thereby compensate for the coolant's temperature rise along the length of the fluid channel. In one embodiment, the fluid channel forms a tapered annulus along its length. The method may also include disposing a tapered body in the fluid channel, and the tapered body may taper upward in the direction of the coolant flow in the fluid channel. The method may further include configuring the cooling wall to define a cooling surface and selecting the area of the cooling wall and the tapered body to maintain a constant temperature cooling surface. The method may further include varying the taper of the tapered body, and/or configuring the fluid channel to be round, or configuring the fluid channel to form stepped portions of increasing diameter along its length. The fluid channel may be drilled or the fluid channel may be extruded.

This invention also features a method for controlling thermal gradients along a fluid channel, the method comprising configuring the fluid channel to vary the velocity of a coolant therein along the length of the fluid channel to vary the coolant's heat transfer coefficient, thereby compensating for the coolant's temperature rise along the length of the fluid channel. The fluid channel may form a tapered annulus along its length. The method may include disposing a tapered body in the fluid channel, and the tapered body may taper upward in the direction of the coolant flow in the fluid channel. The method may further include configuring the cooling wall to define a cooling surface and selecting the area of the cooling wall and the tapered body to maintain a constant temperature cooling surface.

This invention further features a heat sink comprising a fluid channel and a cooling wall in contact with a coolant flowing in the fluid channel. The fluid channel is configured to vary the heat transfer area in contact with the coolant along the length of the fluid channel to compensate for the coolant's temperature rise along the length of the fluid channel. In one example, the fluid channel is configured to form a tapered annulus along its length. The fluid channel may be round, square, rectangular, or a combination of these or other shapes. The cooling wall may be made of aluminum.

This invention also features a heat sink comprising a fluid channel and a cooling wall in contact with a coolant flowing in the fluid channel, the fluid channel configured to vary the heat transfer area in contact with the coolant along the length of the fluid channel. The fluid channel is configured to vary the velocity of the coolant along the length of the fluid channel to vary the coolant's heat transfer coefficient, thereby compensating for the coolant's temperature rise along the length of the fluid channel.

This invention further features a phased array radar system comprising at least one heat sink including a fluid channel and a cooling wall in contact with a coolant flowing in the fluid channel. The fluid channel is configured to vary the heat transfer area in contact with the coolant along the length of the fluid channel and the fluid channel is further configured to vary the velocity of the coolant along the length of the fluid channel to vary the coolant's heat transfer coefficient, to thereby compensate for the coolant's temperature rise along the length of the fluid channel. In one example, the fluid channel is configured to form a tapered annulus along its length, and may include a tapered body therein. In one embodiment, the tapered body tapers upward in the direction of the coolant flow in the fluid channel. The cooling wall typically defines a cooling surface and the area of the cooling wall and the tapered body may be selected to maintain a constant temperature cooling surface. The tapered body may have a variable taper. The fluid channel may be round, and the tapered body may be made of plastic or aluminum. In one example, the cooling wall is made of aluminum. The fluid channel may be configured to form stepped portions of increasing diameter along its length. The coolant may be a gas or a liquid. In one embodiment, the fluid channel is drilled, or the heat sink may be extruded to form the fluid channel. Typically, the cooling surface includes heat sources attached thereto, and the heat sources may be transmit/receive integrated multi-channel modules.

This invention also features a heat transfer method comprising placing heat sources on a cooling wall surrounding a fluid channel, driving a coolant through the fluid channel, and varying the heat transfer area in contact with the coolant along the length of the fluid channel to compensate for the coolant's temperature rise along the length of the fluid channel.

This invention further features a method for controlling thermal gradients along a fluid channel, the method comprising configuring the fluid channel to vary the heat transfer area in contact with a coolant therein along the length of the fluid channel to compensate for the coolant's temperature rise along the length of the fluid channel.

This invention also features a heat transfer method comprising placing heat sources on a cooling wall surrounding a fluid channel, driving a coolant through the fluid channel, varying the heat transfer area in contact with the coolant along the length of the fluid channel, and varying the velocity of the coolant along the length of the fluid channel to vary the coolant's heat transfer coefficient, to thereby compensate for the coolant's temperature rise along the length of the fluid channel.

This invention further features a method for controlling thermal gradients along a fluid channel, the method comprising configuring the fluid channel to: (i) vary the velocity of a coolant therein along the length of the fluid channel to vary the coolant's heat transfer coefficient, and (ii) vary the heat transfer area in contact with the coolant along the length of the fluid channel, thereby compensating for the coolant's temperature rise along the length of the fluid channel.

BRIEF DESCRIPTION OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
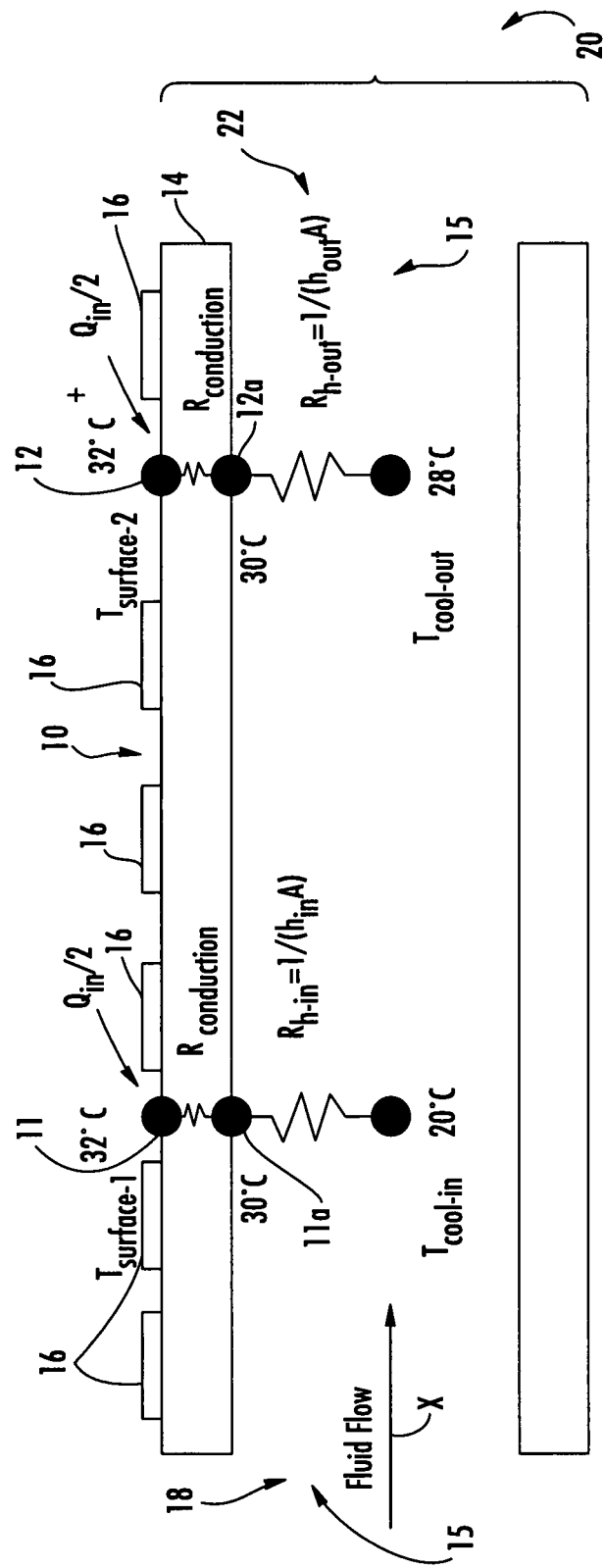
FIG. 1 is a schematic representation of fluid temperature increase in a typical heat sink or manifold.

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

As discussed in the Background section above, thermal gradients occur in fluid cooled heat sinks because, as the fluid travels through the heat sink, it picks up heat from the heat sources. Consequently, the coolant further downstream is at a higher temperature. This condition is shown schematically in FIG. 1. In this example, for an isothermal heat sink, it is desirable that the temperature at all points of surface 10 of heat sink wall 14 should be the same. In one example, the temperature at location 11 of surface 10, namely $T_{surface\text{-}1}$, and the temperature at surface location 12 of surface 10, namely $T_{surface\text{-}2}$, should each be 32° C. In such a case thermal gradients on cooling surface 10 would be eliminated.

With typical heat sinks, however, as coolant flows in the direction of arrow X in channel 15, it picks up heat from the heat sources 16 on cooling surface 10. The temperature of the coolant or fluid $T_{cool-in}$ nearer the entry point or upstream 18 of manifold or heat sink 20 is thus lower than the temperature of the coolant $T_{cool-out}$ farther downstream or closer to the exit 22 of the manifold 20. In the case of a typical coolant where the specific heat remains constant, if $T_{cool-in}$ is 20° C. for example, $T_{cool-out}$ will be 28° C., or 8° C. warmer than $T_{cool-in}$. This results in less effective cooling downstream and a consequent thermal gradient because $T_{surface-2}$ ends up much greater than the desired 32° C.

This less than desirable result is a consequence of the heat introduced into the fluid as well as the fluid qualities. It is known that $T_{cool-out}$ is a function of the fluid mass flow rate, the fluid properties, $Q_{in}$, and $T_{cool-in}$, according to equation (1):

$$Q_{in}=mc_p(T_{cool-out}-T_{cool-in}) \quad (1)$$

where $Q_{in}$ is the heat dissipated into the coolant, m is the mass flow of the fluid, and $c_p$ is the specific heat of the fluid. Also, the thermal resistance $R_{h_{in}}=1/h_{in}A$, where $h_{in}$ is the heat transfer coefficient of the coolant at point 11a and A is the heat transfer area in contact with the coolant. The thermal resistance $R_{h_{out}}=1/h_{out}A$, where $h_{out}$ is the heat transfer coefficient of the coolant at point 12a. Additionally, the temperature $T_{surface-1}$ at point 11 is a function of the temperature of the coolant or fluid $T_{cool-in}$ and the thermal resistance $R_{h_{in}}$ upstream, the thermal resistance $R_{conduction}$ of wall 14, and the heat $Q_{in}$. Consequently, the temperature $T_{surface-2}$ at point 12 is a function of the temperature of the coolant or fluid $T_{cool-in}$, the thermal resistance $R_{h_{out}}$ downstream near exit 22, $R_{conduction}$ and the heat $Q_{in}$.

However, it is also known that heat transfer is a function of the heat transfer coefficient according to:

$$Q=hA(\Delta T) \quad (2)$$

where Q is the heat transferred into the fluid, h is the is the heat transfer coefficient of the fluid, $\Delta T$ is change in temperature of the fluid, and A is the heat transfer area.

The inventors have observed that the heat coefficient h is a function of and proportional to the velocity of the coolant or fluid, and that by increasing the fluid velocity, the heat coefficient h can also be increased. The inventors further observed that according to equation (2), if Q were constant, the change in temperature $\Delta T$ would decrease. Thus, in the example of FIG. 1, the surface temperature, $T_{surface-2}$, associated with point 12 on surface 10 could be decreased by a desired amount depending on the amount of increase in velocity of the fluid at that point.

The inventors further observed that the velocity of the fluid or coolant could be varied—increased in the example of FIG. 1—by configuring the fluid channel of the manifold or heat sink to vary the velocity and thus the coolant's heat transfer coefficient, thereby compensating for the coolant's temperature rise along the length of the fluid channel of the heat sink.

Figure 2:
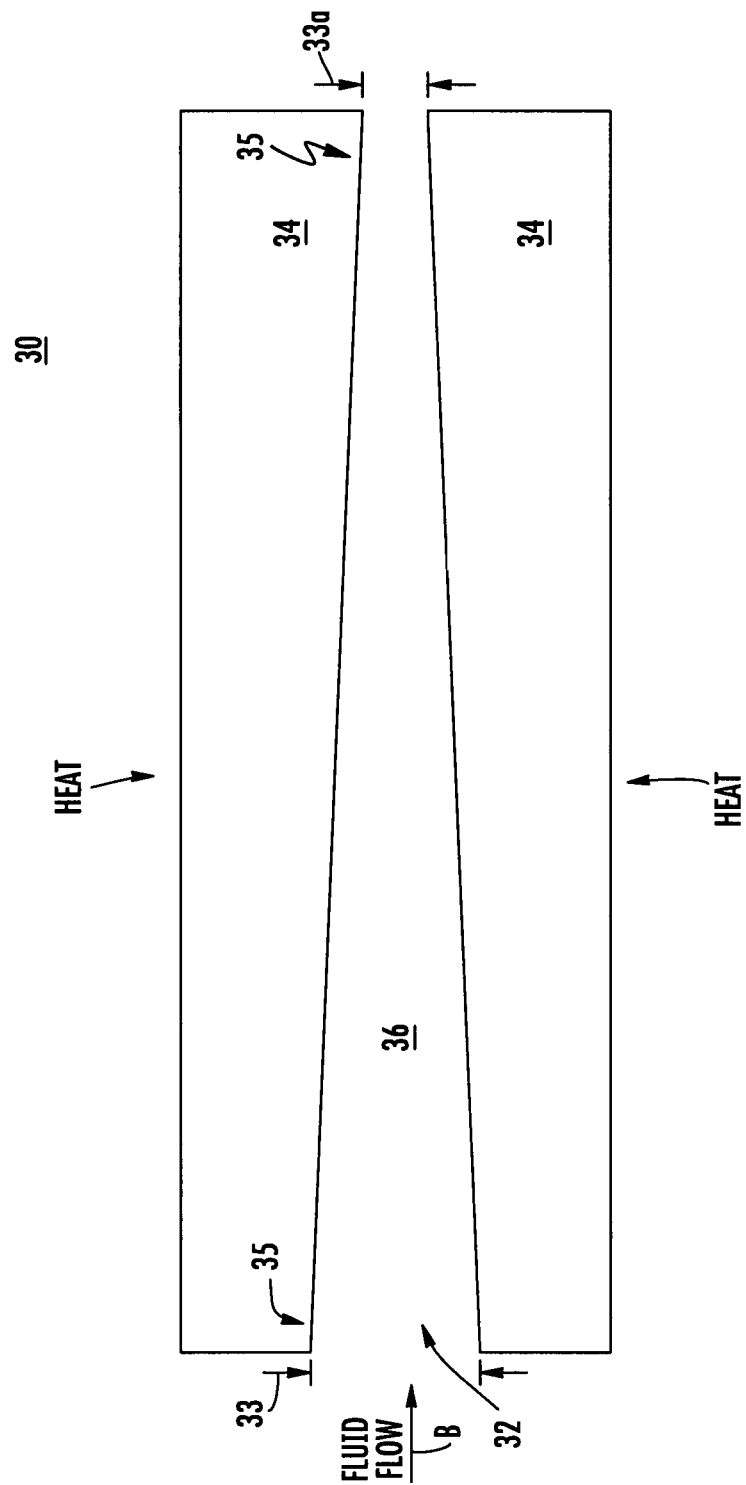
FIG. 2 is a schematic cross-sectional side view of one embodiment of a heat sink in accordance with the subject invention.

In one example, heat sink or manifold 30, FIG. 2 in accordance with the present invention includes fluid channel 32, and cooling wall 34 in contact with coolant 36 flowing in fluid channel 32. Cooling wall 34 is configured to vary the velocity of the coolant along the length of the fluid channel to vary the heat transfer coefficient of coolant 36, and thereby compensate for the coolant's temperature rise along the length of fluid channel 32. Coolant 36 may be a gas, such as air, or a liquid, such as water.

In this example, fluid channel 32 is configured to form a tapered channel along its length as shown. The area 33 that coolant 36 passes through on the upstream end of the coolant flow in heat sink 30 is larger than area 33a at the downstream end. Thus, because a constant amount of fluid 36 must pass through both areas 33 and 33a, the velocity of coolant 36 increases as it flows downstream and eventually passes through area 33a and beyond. Also in the example of FIG. 2, heat transfer area 35 in contact with coolant 36 decreases as coolant 38 flows downstream, partially reducing the positive effect gained by increasing the coolant velocity. However, these two conflicting effects can be used individually or together to achieve a lower thermal gradient and can be tailored for a specific purpose, and when used in conjunction with a tapered body can be tailored to particular advantage as discussed more fully below.

Figure 3:
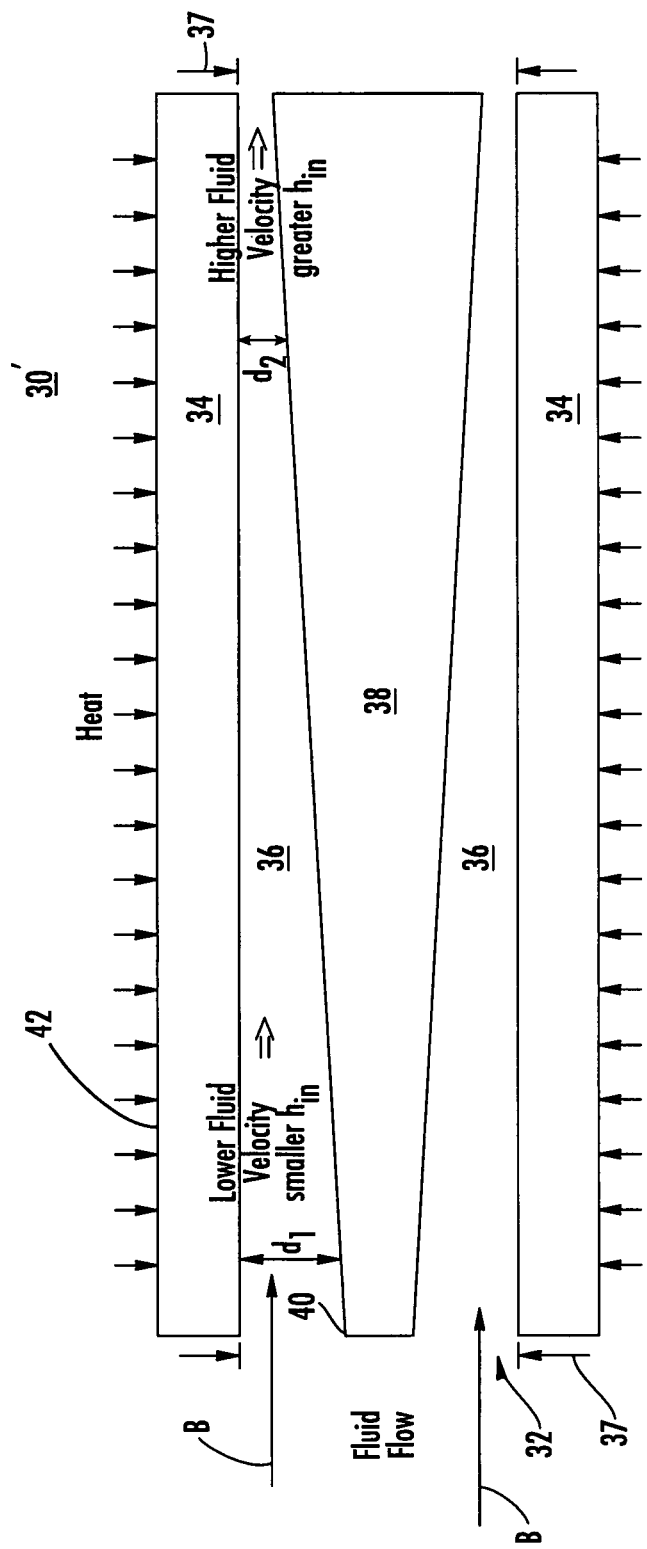
FIG. 3 is a schematic cross-sectional side view of another embodiment of a heat sink in accordance with the present invention including a tapered body.

In another embodiment, cooling wall 34, FIG. 3 has a constant area 37 along the length of channel 32 and fluid channel 32 includes tapered body 38 therein, that forms a tapered annulus. In one example, fluid channel is round. Preferably, tapered body 38 tapers upward in the direction of coolant flow, as shown by arrows B, in fluid channel 32. In this example, the circumference 40 of tapered body 38 is at a greater distance d, from cooling wall 34 upstream in the fluid flow, and at a lesser distance $d_2$ from cooling wall 34 further downstream. Tapered body 38 and cooling wall 34 may be made of any material as desired for a particular application, but in one preferred example cooling wall 34 is made of aluminum and tapered body 38 is made of plastic or aluminum.

Typically, cooling wall 34 defines cooling surface 42 and the area of cooling wall 34 and tapered body 38 are selected to maintain a constant temperature cooling surface 42. As discussed in the example above, to compensate for the temperature change of coolant 36 as it flows through fluid channel 32—and thus avoid thermal gradients—the heat transfer coefficient h of coolant 36 is varied as it passes through channel 32 by varying the velocity of coolant 36. In one example, the velocity can be varied by selecting the area of tapered body 38 such that it has a greater area at the downstream end 40a, which would result in increased coolant velocity downstream. Alternatively or in addition, the area of cooling wall 34 may be selected to be smaller at the downstream end (not shown), also resulting in increased fluid velocity downstream.

Thus, it can be seen that the amount of change in velocity, and thus the amount of change to the heat transfer coefficient h at desired points along the length of heat sink 30', can be varied as desired for a particular application in order to maintain a constant temperature cooling surface 42 by selecting the areas of cooling wall 34 and tapered body 38. The same "tuning" can be accomplished absent the tapered body, by selecting the area of cooling wall 34 as appropriate for a particular application to prevent thermal gradients. As shown in the example of FIG. 2, the area 33 of cooling wall 34 of heat sink 30 is varied such that it is less upstream and area 33a is greater downstream. This is also the case in FIG. 4, which shows heat sink 30" with fluid channel 32 configured to form stepped portions 44 of increasing diameter along the length of channel 32.

Figure 4:
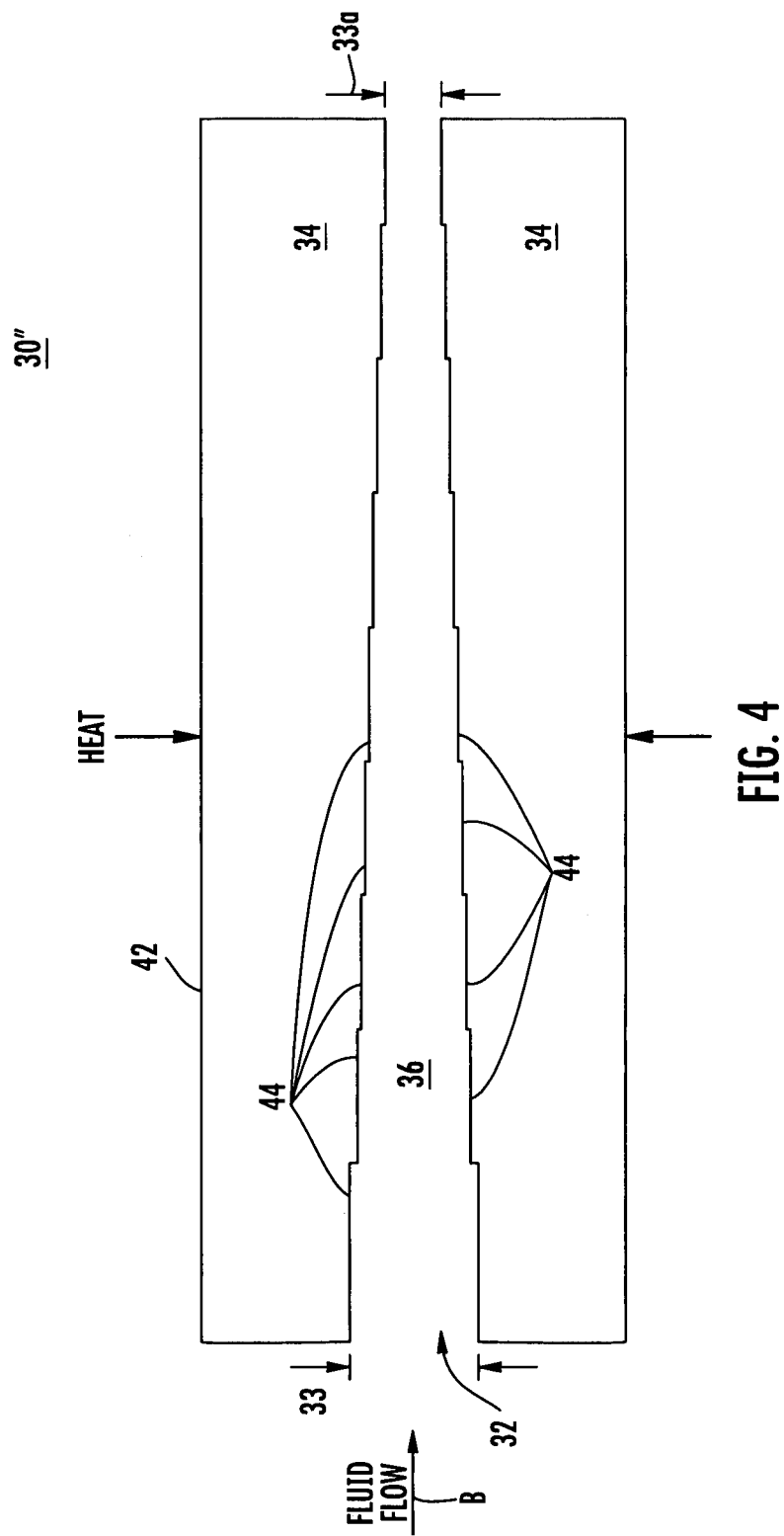
FIG. 4 is a schematic cross-sectional side view of a further embodiment of a heat sink in accordance with the present invention.

In each of the FIGS. 2-4, the velocity of the coolant continues to increase as it flows downstream, but this is not a necessary limitation of the invention. In addition, the velocity of the coolant may be varied as it flows downstream, as shown in FIG. 5 for example.

Figure 5:
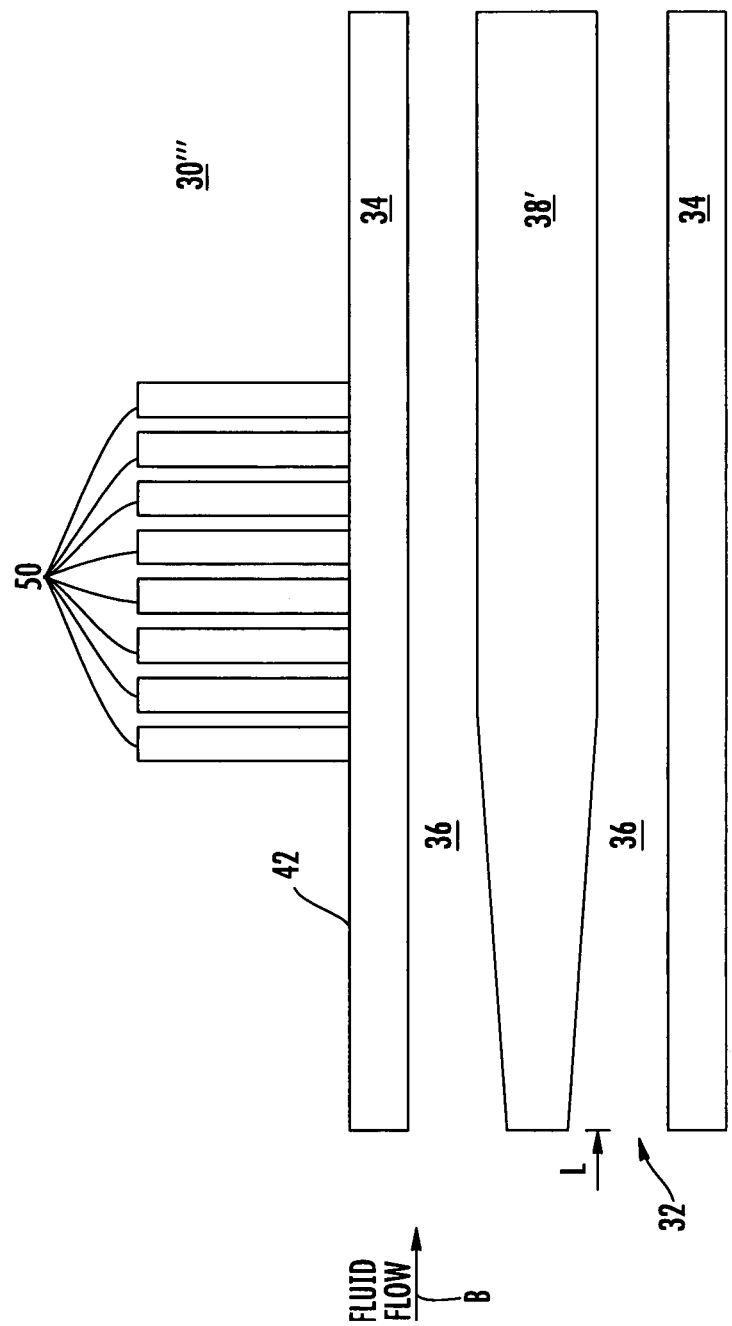
FIG. 5 is a schematic cross-sectional side view of another embodiment of a heat sink in accordance with the present invention showing a tapered body therein.

In FIG. 5, tapered body 38' has a variable taper, such that it tapers upward for the first approximately one-third of its length L, and does not taper for the remaining approximately two-thirds of its length L. This variable tapered body 38' may be used, for example, where there are a number of heat sources 50 on cooling wall 42 only near the second one-third of tapered body 38' and greater cooling is required in this region in order to minimize thermal gradients.

Figure 6:
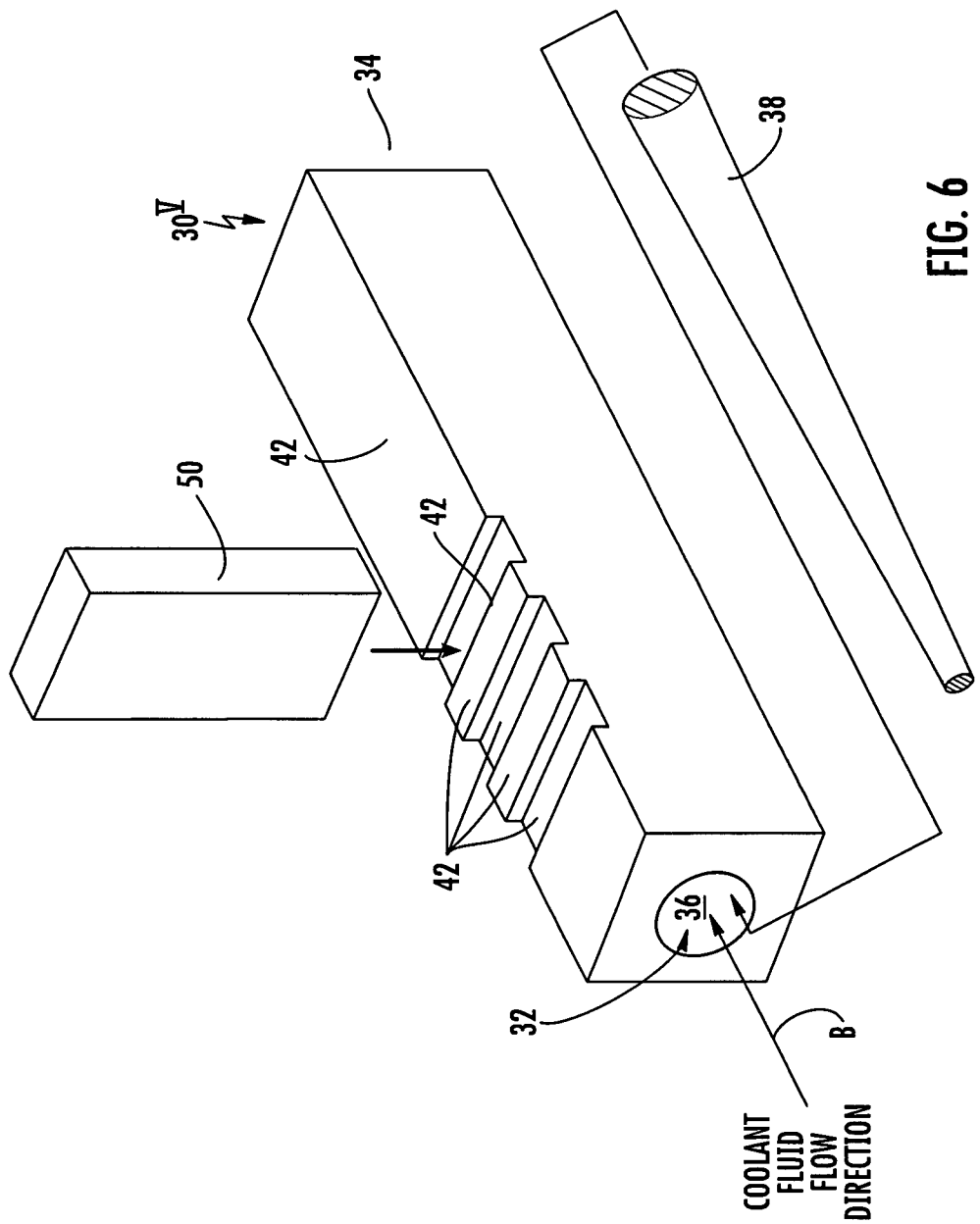
FIG. 6 is a schematic three-dimensional exploded view of an embodiment of a heat sink in accordance with the subject invention including a tapered body and showing a transmit/receive integrated multichannel module (T/RIMM) attached thereto.

FIG. 6 shows a three-dimensional exploded view of an example of heat sink 30$^{IV}$ in accordance with the subject invention including tapered body 38 and showing a heat sources 50 (only one of which is shown) mounted thereon or attached thereto. In this embodiment, heat sources 50 are transmit/receive integrated multi-channel modules or T/RIMMs.

As noted above however, the subject invention is not limited to increasing or varying the coolant velocity in the heat sink. In other embodiments, the heat sink may be configured to vary the heat transfer surface—with or without varying coolant velocity—in order to compensate for coolant temperature changes along the length of the fluid channel in the heat sink.

Figure 7:
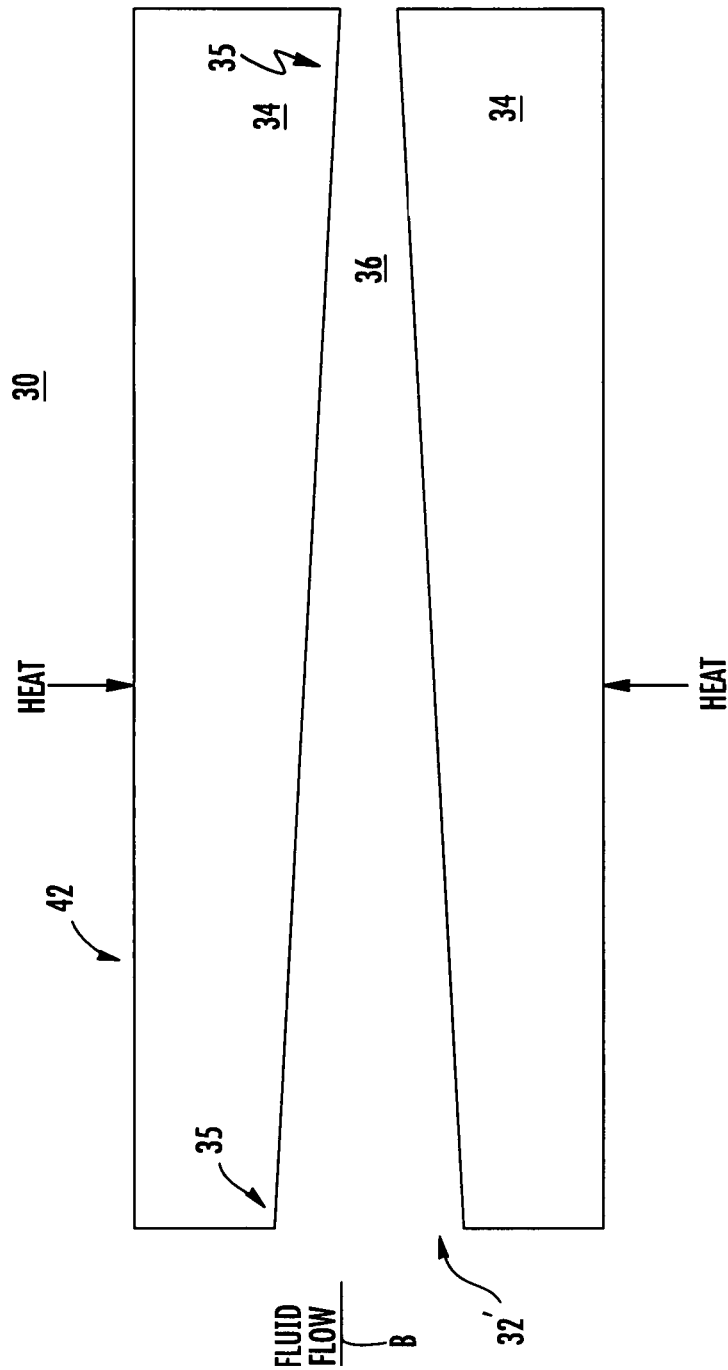
FIG. 7 is a schematic cross-sectional side view of another embodiment of a heat sink in accordance with the present invention including an increased heat transfer area.
Figure 8:
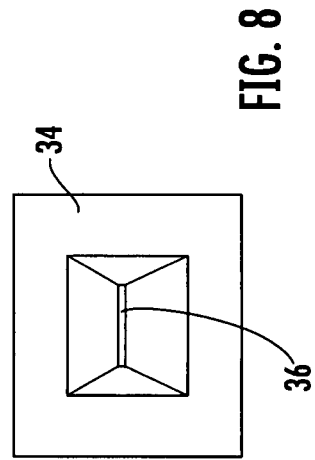
FIG. 8 is a schematic end view of the heat sink of FIG. 7.

In FIG. 7 heat transfer area 35 in contact with coolant 36 increases as coolant 36 flows downstream in the direction shown by arrow B, which provides greater cooling at the downstream end. In this example, as shown in FIG. 8, the heat transfer area is larger on the downstream end than on the upstream end, but because of the configuration of channel 32' (a square at the upstream end and a thin rectangle at the downstream end) the velocity of coolant 36 decreases very little or not at all. Thus, the cooling effect is achieved nearly exclusively by the increase in heat transfer area as the coolant flows downstream. Other channel shapes may be used, and the subject invention is not limited to the square and rectangular shapes shown in FIG. 8.

Figure 9:
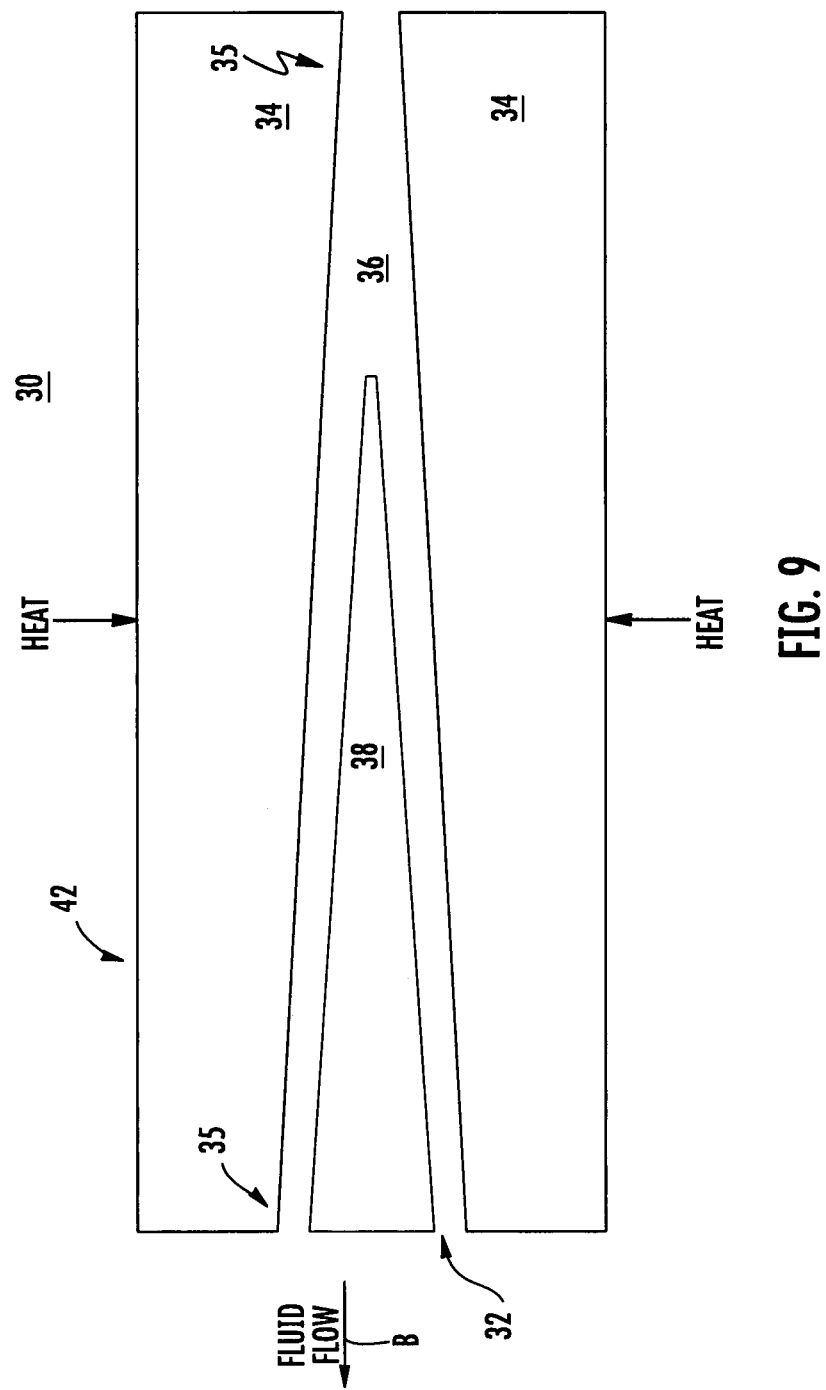
FIG. 9 is a schematic cross-sectional side view of another embodiment of a heat sink in accordance with the present invention including an increased heat transfer area and a tapered body.

In a further example, the addition of tapered body 38, FIG. 9, to channel 32 increases the velocity of coolant 38 at the downstream end, while also increasing heat transfer area 35 at the downstream end of annulus or channel 32. In one example channel 32 may be configured to form a tapered annulus along its length. Thus, in this embodiment the heat sink of the present invention allows both the velocity of the coolant and the heat transfer area to be tailored such that a constant thermal gradient is achieved at various locations on cooling wall 42.

In each embodiment, the heat sink in accordance with the present invention provides the advantage of reducing or eliminating thermal gradients. Additionally, the fluid channels—whether or not a tapered body is included therein—do not need to be tailored or customized to effect a particular "calibration". Thus, the heat sink of the present invention is less complex to manufacture, provides more flexibility in actual usage, and its effectiveness is not reduced by changing conditions in the system with which it is used. Moreover, the fluid channel of the heat sink of the present invention may be drilled, such as by gun drilling, or it may be extruded to form the fluid channel.

Thus, the heat sink of the present invention does not suffer from the shortcomings of brazed aluminum heat sinks, for example, which have size limitations and are difficult to rework.

Figure 10:
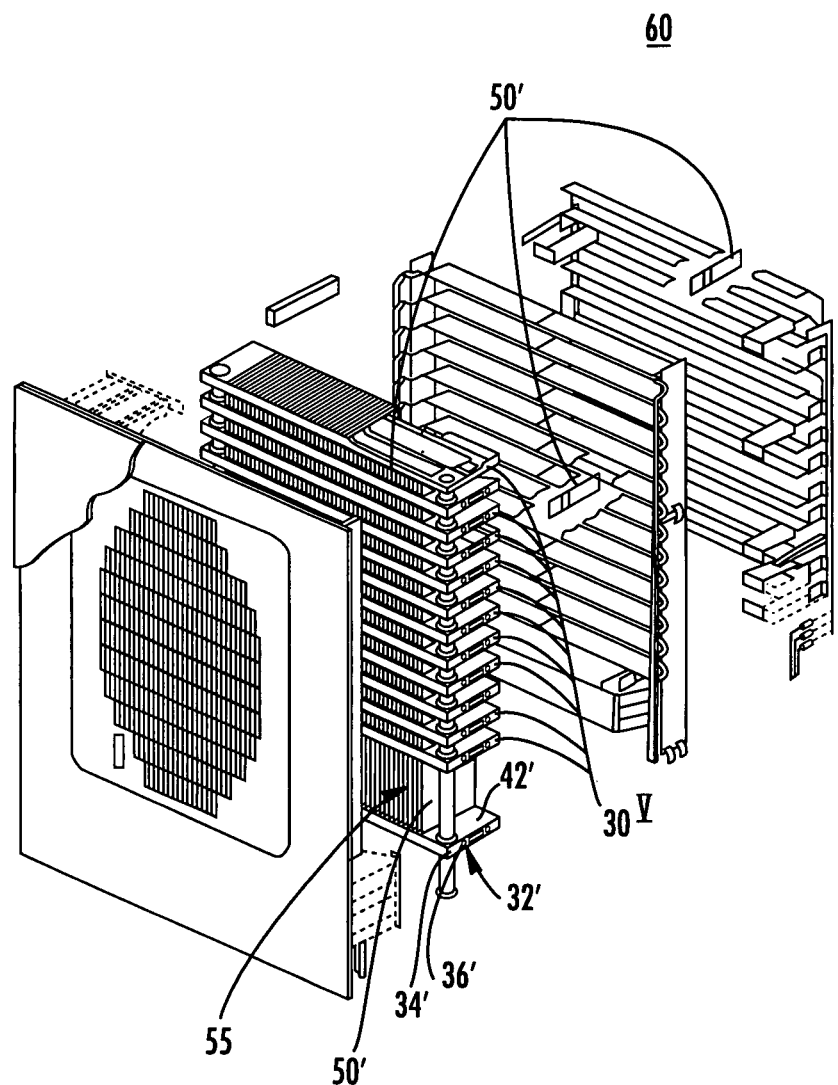
FIG. 10 is a schematic three-dimensional top exploded view of an embodiment of a phased array radar system including an array of T/RIMMs disposed between heat sinks in accordance with the subject invention.
Figure 11:
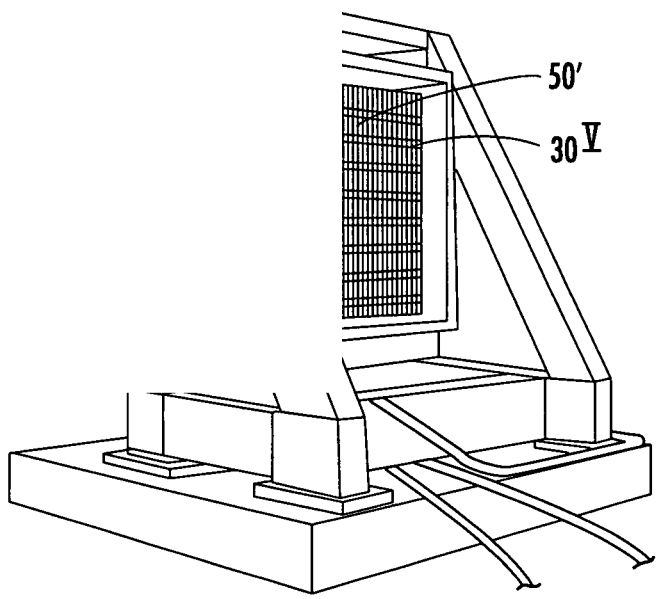
FIG. 11 is a schematic three-dimensional view of an embodiment of a T/RIMM based phase array radar system including heat sinks in accordance with the subject invention.

Also, as discussed in the Background section above, phased array radar systems specifically require control of thermal gradients at many levels. One phased array radar system 60, FIG. 10 in accordance with the present invention includes at least one heat sink 30$^V$ including fluid channel 32' and a cooling wall 34' in contact with coolant 36' flowing in fluid channel 32', where cooling wall 34' is configured to vary the velocity of coolant 36' along the length of fluid channel 32' to vary the heat transfer coefficient of coolant 36' and thereby compensate for the coolant's temperature rise along the length of fluid channel 32'. Phased array radar system 60 further includes a plurality or array 55 of transmit/receive integrated multi-channel modules 50' mounted on or attached to cooling wall 34'. Phased array radar system 60 may include any of the embodiments of the heat sinks in accordance with the present invention as described herein also including but not limited, for example, to a constant area cooling wall 34' with a tapered body (not shown) in fluid channel 32'. Thus, although the temperature of cooling surface 42' may increase, it remains uniform even if the power or duty cycle of the phased array radar system is increased. Accordingly phased array radar system 60, FIGS. 10 and 11, in its various embodiments in accordance with this invention, helps to meet the important and challenging requirements of controlling thermal gradients to effect better overall performance of the system.

Moreover, in accordance with the present invention, heat transfer methods and methods for controlling thermal gradients along a fluid channel may include the heat sink or manifolds described herein, or may be included in the heat sink or manifolds herein.

Figure 12:
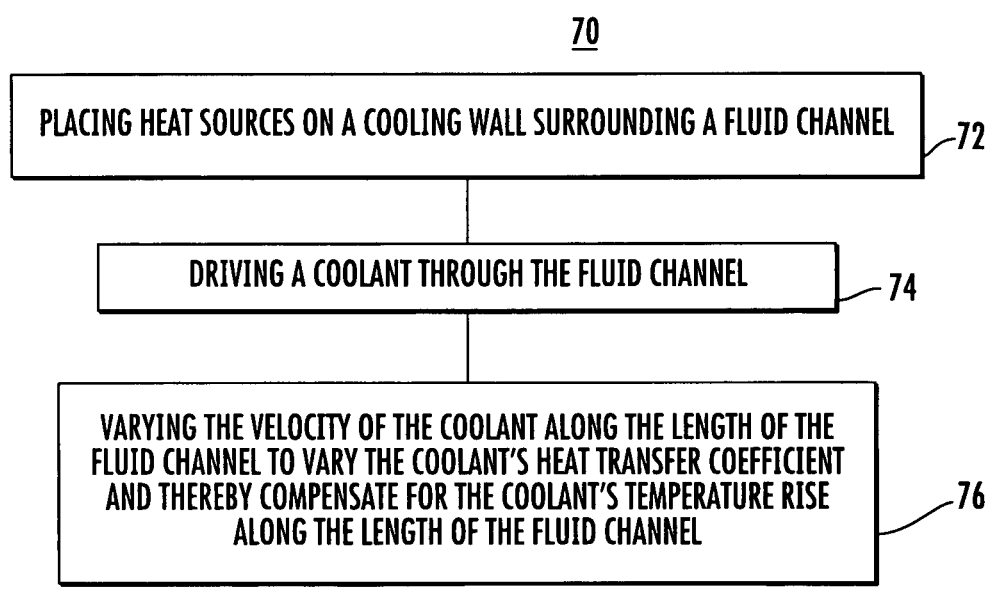
FIG. 12 is a flow chart depicting the primary steps associated with one example of a heat transfer method in accordance with the subject invention.

One heat transfer method 70, FIG. 12 includes placing heat sources on a cooling wall surrounding a fluid channel, step 72, driving a coolant through the fluid channel, step 74, and varying the velocity of the coolant along the length of the fluid channel to vary the coolant's heat transfer coefficient and thereby compensate for the coolant's temperature rise along the length of the fluid channel, step 76. In one example, the method includes the fluid channel forming a tapered annulus along its length. In another example, the method includes disposing a tapered body in the fluid channel. The method may further include tapering the body upward in the direction of the coolant flow in the fluid channel. In one preferred embodiment, the method includes configuring the cooling wall to define a cooling surface and selecting the area of the cooling wall and the tapered body to maintain a constant temperature cooling surface. The method may include varying the taper of the tapered body, configuring the fluid channel to be round, or configuring the fluid channel to form stepped portions of increasing diameter along its length. The method may include drilling the fluid channel, or extruding the fluid channel.

Figure 13:
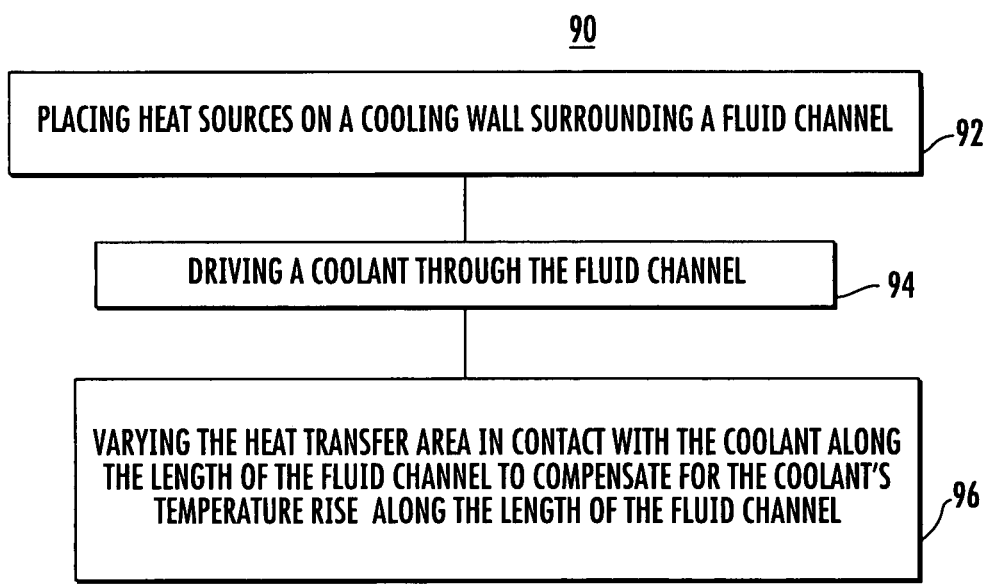
FIGS. 13-14 are flow charts depicting the primary steps associated with examples of heat transfer methods in accordance with the subject invention.

Another heat transfer method 90, FIG. 13 includes placing heat sources on a cooling wall surrounding a fluid channel, step 92, driving a coolant through the fluid channel, step 94, and varying the heat transfer area in contact with the coolant along the length of the fluid channel to compensate for the coolant's temperature rise along the length of the fluid channel, step 96.

Figure 14:
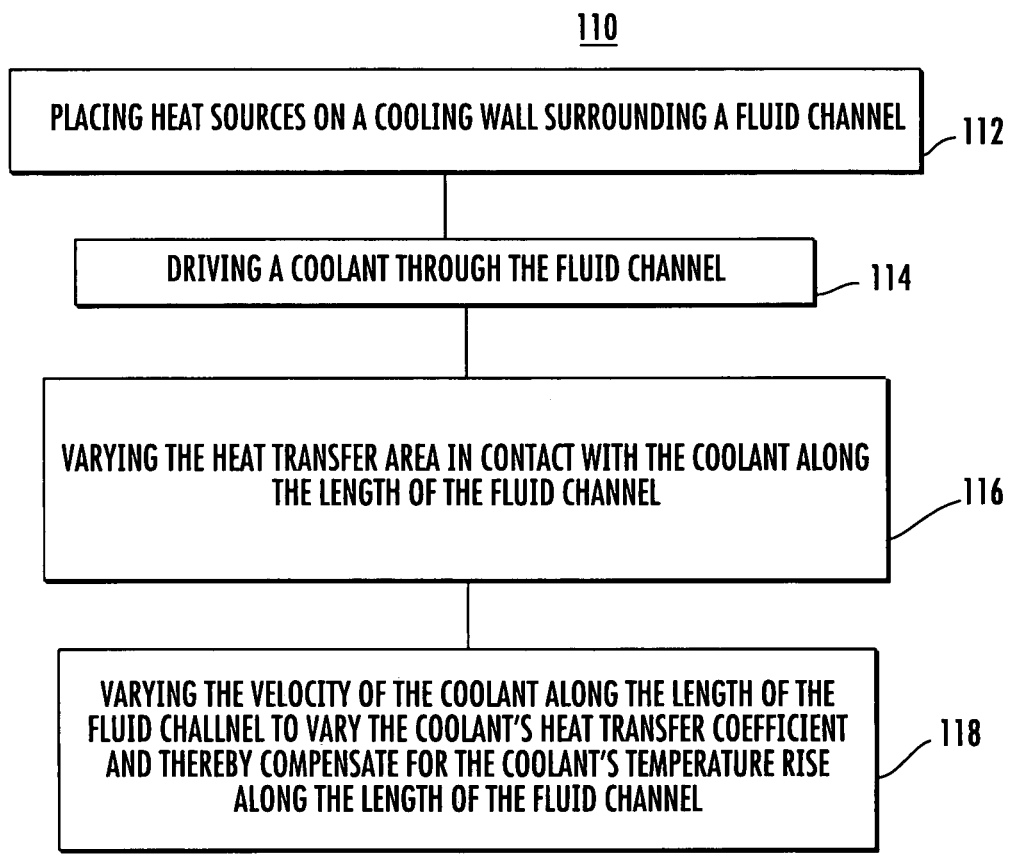

A further heat transfer method 110, FIG. 14 includes placing heat sources on a cooling wall surrounding a fluid channel, step 112, driving a coolant through the fluid channel, step 114, varying the heat transfer area in contact with the coolant along the length of the fluid channel, step 116, and varying the velocity of the coolant along the length of the fluid channel to vary the coolant's heat transfer coefficient, to thereby compensate for the coolant's temperature rise along the length of the fluid channel, step 118.

Also in accordance with the present invention, one method for controlling thermal gradients along a fluid channel includes configuring the fluid channel to vary the velocity of a coolant therein along the length of the fluid channel to vary the coolant's heat transfer coefficient, thereby compensating for the coolant's temperature rise along the length of the fluid channel. In one example, the method includes forming the fluid channel as a tapered annulus along its length, and in another example the method includes disposing a tapered body in the fluid channel. The method may further include tapering the tapered body upward in the direction of fluid flowing in the fluid channel. In one preferred embodiment the method further includes configuring the cooling wall to define a cooling surface and selecting the area of the cooling wall and the tapered body to maintain a constant temperature cooling surface.

Another method for controlling thermal gradients along a fluid channel includes configuring the fluid channel to vary heat transfer area in contact with a coolant therein along the length of the fluid channel to compensate for the coolant's temperature rise along the length of the fluid channel.

A further method for controlling thermal gradients along a fluid channel includes configuring the fluid channel to: (i) vary the velocity of a coolant therein along the length of the fluid channel to vary the coolant's heat transfer coefficient; and (ii) vary the heat transfer area in contact with the coolant along the length of the fluid channel, thereby compensating for the coolant's temperature rise along the length of the fluid channel.

Accordingly, the heat sinks, phased array radar systems, and the methods of the present invention thus provide improved and effective control and reduction of thermal gradients.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments. Other embodiments will occur to those skilled in the art and are within the following claims.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

What is claimed is:

1. A heat sink comprising:
   a fluid channel; and
   a cooling wall in contact with a coolant flowing in the fluid channel, said cooling wall increasing in area along the length of the fluid channel in the direction of coolant flow;
   the fluid channel configured to increase the heat transfer area in contact with the coolant along the length of the fluid channel to compensate for the coolant's temperature rise along the length of the fluid channel.

2. The heat sink of claim 1 in which the fluid channel is configured to form a tapered annulus along its length.

3. The heat sink of claim 1 in which the fluid channel is round.

4. The heat sink of claim 1 in which the fluid channel is square.

5. The heat sink of claim 1 in which the fluid channel is rectangular.

6. The heat sink of claim 1 in which the fluid channel includes a tapered body therein, said tapered body tapering upward in the direction of the coolant flowing in the fluid channel.

7. A phased array radar system comprising:
   at least one heat sink including:
      a fluid channel; and
      a cooling wall in contact with a coolant flowing in the fluid channel, said cooling wall increasing in area along the length of the fluid channel in the direction of coolant flow, the fluid channel configured to increase the heat transfer area in contact with the coolant along the length of the fluid channel, to vary the coolant's heat transfer coefficient, to thereby compensate for the coolant's temperature rise along the length of the fluid channel.

8. The phased array radar system of claim 7 in which the fluid channel is configured to form a tapered annulus along its length.

9. The phased array radar system of claim 7 in which the fluid channel includes a tapered body therein.

10. The phased array radar system of claim 9 in which the tapered body tapers upward in the direction of the coolant flow in the fluid channel.

11. The phased array radar system of claim 9 in which the cooling wall defines a cooling surface and the area of the cooling wall and the tapered body are selected to maintain a constant temperature cooling surface.

12. The phased array radar system of claim 9 in which the tapered body has a variable taper.

13. The phased array radar system of claim 7 in which the fluid channel is round.

14. The phased array radar system of claim 7 in which the tapered body is made of plastic.

15. The phased array radar system of claim 7 in which the tapered body is made of aluminum.

16. The phased array radar system of claim 7 in which the cooling wall is made of aluminum.

17. The phased array radar system of claim 7 in which the fluid channel is configured to form stepped portions of increasing diameter along its length.

18. The phased array radar system of claim 7 in which said coolant is a gas.

19. The phased array radar system of claim 7 in which said coolant is a liquid.

20. The phased array radar system of claim 7 in which the fluid channel is drilled.

21. The phased array radar system of claim 7 in which the heat sink is extruded to form the fluid channel.

22. The phased array radar system of claim 7 wherein the cooling surface includes heat sources attached thereto.

23. The phased array radar system of claim 7 wherein the heat sources are transmit/receive integrated multi-channel modules.

* * * * *

UNITED STATES PATENT AND TRADEMARK OFFICE
CERTIFICATE OF CORRECTION

| | | |
|---|---|---|
| PATENT NO. | : 8,757,246 B2 | Page 1 of 1 |
| APPLICATION NO. | : 11/447488 | |
| DATED | : June 24, 2014 | |
| INVENTOR(S) | : McCordic et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1002 days.

Signed and Sealed this
First Day of December, 2015

Michelle K. Lee
*Director of the United States Patent and Trademark Office*